United States Patent
Burns et al.

(10) Patent No.: US 7,523,830 B2
(45) Date of Patent: Apr. 28, 2009

(54) WAFER CONTAINER WITH SECONDARY WAFER RESTRAINT SYSTEM

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 512 days.

(21) Appl. No.: 11/284,795

(22) Filed: Nov. 22, 2005

(65) Prior Publication Data

US 2006/0108258 A1 May 25, 2006

Related U.S. Application Data

(60) Provisional application No. 60/630,546, filed on Nov. 23, 2004.

(51) Int. Cl.
*B55D 85/00* (2006.01)
(52) U.S. Cl. .................. 206/711; 206/710; 206/454
(58) Field of Classification Search ............. 206/454, 206/711, 710, 722, 723, 832, 833; 414/217.1, 414/936, 940; 211/41.18; 118/500
See application file for complete search history.

(56) References Cited

U.S. PATENT DOCUMENTS

| | | | | |
|---|---|---|---|---|
| 4,721,207 A | * | 1/1988 | Kikuchi | 206/307 |
| 5,782,362 A | | 7/1998 | Ohori | |
| 6,082,540 A | * | 7/2000 | Krampotich et al. | 206/445 |
| 6,267,245 B1 | | 7/2001 | Bores et al. | |
| 6,315,124 B1 | | 11/2001 | Hirohata et al. | |
| 6,644,477 B2 | * | 11/2003 | Bores et al. | 206/711 |
| 7,017,749 B2 | * | 3/2006 | Yajima et al. | 206/711 |
| 2003/0132133 A1 | | 7/2003 | Cheesman et al. | |
| 2003/0159971 A1 | * | 8/2003 | Bores et al. | 206/711 |
| 2003/0221985 A1 | * | 12/2003 | Yajima et al. | 206/454 |
| 2005/0161367 A1 | * | 7/2005 | Matsutori et al. | 206/711 |
| 2006/0027477 A1 | * | 2/2006 | Matsutori et al. | 206/454 |
| 2006/0042998 A1 | * | 3/2006 | Haggard et al. | 206/711 |

* cited by examiner

*Primary Examiner*—David T Fidei
(74) *Attorney, Agent, or Firm*—Patterson, Thuente, Skaar & Christensen, P.A.

(57) ABSTRACT

A wafer container providing improved wafer restraint during physical shock events. In embodiments of the invention, a secondary wafer restraint structure defining a plurality of notches is interposed between opposing wafer restraint members on the door of the container. The notches may be defined by one or more converging edges or surfaces meeting at a junction. The junctions are positioned so as to align with the wafer receiving portions of each opposing pair of wafer restraint member so that when the door is fully sealingly engaged with the enclosure of the container, the edge of the wafer is contacting the junction. In this position, any vertical movement of the wafer due to shock imparted to the container causes the wafer to contact the converging surfaces or edges, thereby limiting such movement. The positioning of the secondary wafer restraint structure between and proximate opposing fingers of the primary wafer restraint limits deflection of the wafer between support points and thereby further inhibits the wafer from "jumping" out of the supports and cross-slotting.

20 Claims, 4 Drawing Sheets

WAFER CONTAINER WITH SECONDARY WAFER RESTRAINT SYSTEM

RELATED APPLICATIONS

This application claims the benefit of U.S. Provisional Patent Application No. 60/630,546, entitled WAFER CONTAINER WITH SECONDARY WAFER RESTRAINT SYSTEM and filed on Nov. 23, 2004, hereby fully incorporated herein by reference.

FIELD OF THE INVENTION

The present invention relates generally to sealable containers for semiconductor wafers and more specifically to wafer restraint systems for wafer containers.

BACKGROUND OF THE INVENTION

The transformation of semi-conductor wafer disks into integrated circuit chips often involves many steps where the disks are repeatedly processed, stored and transported. The wafers must be transported from workstation to workstation and from facility to facility. Wafer disks are brittle and are easily damaged by physical shock. Also, build-up and discharge of static charges in the vicinity of semiconductor wafers can be catastrophic. Due to the delicate nature of the wafers and their extreme value, it is vital that they are properly protected throughout these procedures from contaminates, and physical and electrical damage.

Specialized carriers or containers are used for handling, storing, and shipping wafers. Such devices normally hold the wafers in axially aligned arrays with, for example, twenty-five wafers in an array. A principal component of the containers is a means for supporting the wafers during handling to protect against physical damage from shock and vibration. This wafer support means may be provided with a path to ground for static dissipation through a machine interface on the bottom of the container.

The prior art containers typically have wafer restraint structures on the door of the container that cooperate with the wafer supports in the container when the door is in place. These wafer restraint structures function to cushion the wafers and restrain their movement to prevent damage from shock. Prior wafer restraint structures, however, have not been quite satisfactory in some cases. In some cases, the wafer restraint structures may enable the wafer to translate too far vertically during physical shock events, causing damage to the wafer itself or to adjacent wafers. In some cases, the wafer may even be dislodged from the wafer restraints. In other cases, wafers may become cross-slotted between adjacent wafer restraints during such physical shock events.

What is needed in the industry is an improved wafer restraint system for a wafer carrier that alleviates the aforementioned problems by providing improved wafer restraint during physical shock events.

SUMMARY OF THE INVENTION

The present invention is a wafer container with an improved wafer restraint system that addresses the need of the industry by providing improved wafer restraint during shock events. In the invention, a secondary wafer restraint structure is interposed between opposing wafer restraint members on the door of the container. In an embodiment of the invention, the secondary wafer restraint structure defines a plurality of notches The notches may be synclinally shaped and defined by one or more converging edges or surfaces meeting at a junction. The junctions are positioned so as to align with the wafer receiving portions of each opposing pair of wafer restraint member so that when the door is fully sealingly engaged with the enclosure of the container, the edge of the wafer is contacting the junction. In this position, any vertical movement of the wafer due to shock imparted to the container causes the wafer to contact the converging surfaces or edges, thereby limiting such movement. The positioning of the secondary wafer restraints between and proximate opposing fingers of the primary wafer restraint limits deflection of the wafer between support points and thereby further inhibits the wafer from "jumping" out of the supports and cross-slotting.

Accordingly, an embodiment of the invention includes the combination of a plurality of wafers and a container for holding the wafers in an axially aligned, generally parallel spaced apart arrangement. The container includes an enclosure portion having a top, a bottom, a pair of opposing sides, a back and an opposing open front defined by a door frame, and a door sealingly receivable in the door frame to close the open front. The container includes a wafer restraint system with at least one wafer support structure in the enclosure portion and a wafer restraint structure on the door for engaging and restraining the wafers. The at least one wafer support structure may include a plurality of wafer support shelves defining a plurality of slots, each slot adapted to receive a separate one of the plurality of wafers. The wafer restraint structure on the door has a primary restraint structure and a secondary restraint structure. The primary restraint structure includes a plurality of resilient wafer engaging members arranged so that a first plurality of the wafer engaging members is spaced apart from and opposing a second plurality of the wafer engaging members. The secondary restraint structure is positioned intermediate the first and second pluralities of wafer engaging members and defines a plurality of notches. The notches are arranged so that a separate one of the plurality of wafers is received in each notch when the door is engaged in the door frame.

In an embodiment, each of the resilient wafer engaging members may have a first elongate connecting portion and a first synclinally shaped wafer receiving portion. The first wafer receiving portion is positioned proximate a first end of the first connecting portion and a second end of the first connecting portion being operably coupled with the door. Further, each resilient wafer engaging member may have a second elongate portion and a second synclinally shaped wafer receiving portion. A first end of the second elongate portion is operably coupled with the first connecting portion proximate the first wafer receiving portion and the second wafer receiving portion is positioned on the second connecting portion at a location spaced apart from the first wafer receiving portion.

In an embodiment, the wafer restraint structure may include a body portion having a pair of opposing sides and a center portion. The resilient wafer engaging members of the primary restraint structure project inwardly toward the center portion from each of the opposing sides. The body portion of the wafer restraint structure may have a raised portion proximate the center, wherein the raised portion defines the notches of the secondary restraint structure.

In embodiments of the invention, the notches may each defined by a pair of converging edges meeting at a junction. Each junction is positioned so that when the door is fully received in the door frame, each wafer contacts a separate one of the junctions. Moreover, the secondary restraint structure may integrally formed with the interior side of the door.

An object and advantage of embodiments of the present invention is to inhibit movement of wafers during physical shock events occurring to a wafer container.

A further object and advantage of embodiments of the present invention is to reposition a wafer that is displaced from a wafer restraint due to a physical shock occurring to the wafer container.

A still further object and advantage of embodiments of the present invention is to inhibit cross-slotting between wafer restraints due to a physical shock occurring to the wafer container.

Additional objects, advantages, and novel features of the invention will be set forth in part in the description which follows, and in part will become apparent to those skilled in the art upon examination of the following or may be learned by practice of the invention.

DETAILED DESCRIPTION OF THE INVENTION

Figure 1:
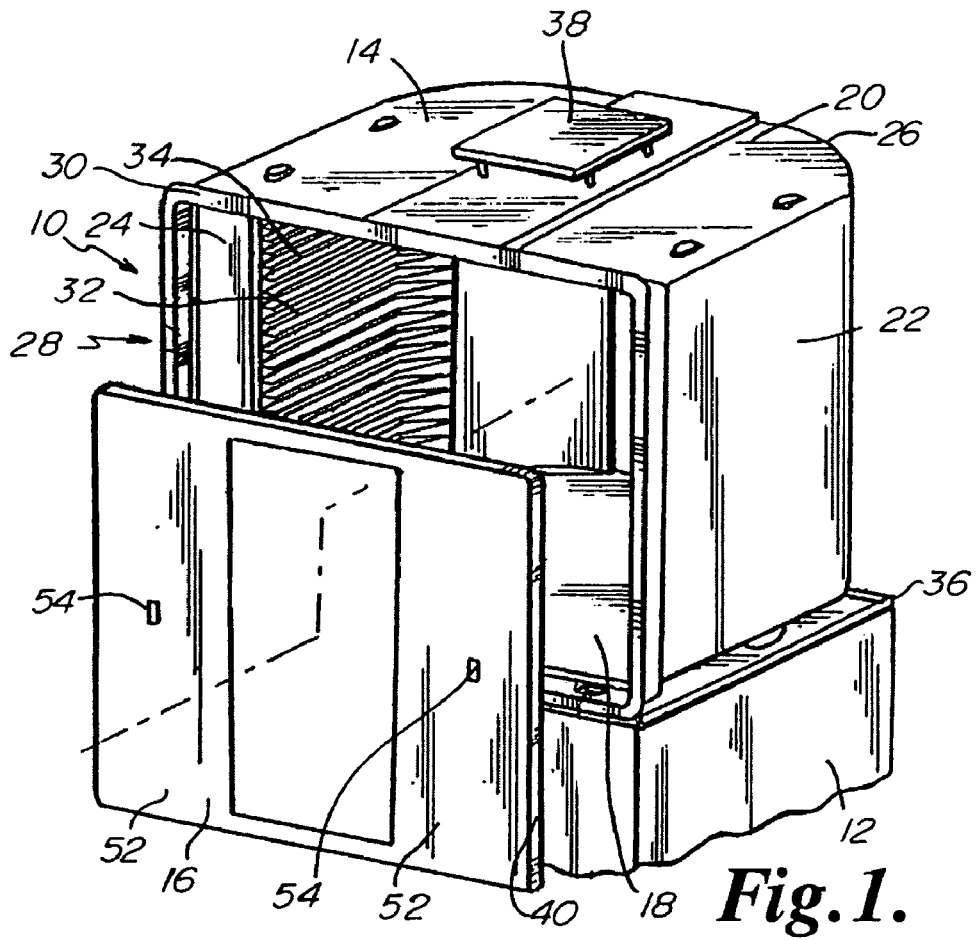
FIG. 1 is a perspective view of a wafer container according to an embodiment of the present invention.

A wafer container 10 according to the present invention is depicted in FIG. 1 situated on a piece of processing equipment 12. Wafer container 10 generally includes enclosure 14 and door 16. Enclosure 14 is generally formed from polycarbonate or other suitable thermoplastic material, and includes bottom 18, top 20, opposing sides 22, 24, and back 26. Opposite back 26 is an open front 28 defined by a door frame 30. One or more wafer support structures 32 with a plurality of wafer support shelves 34 are positioned inside enclosure 14 to receive a plurality of semiconductor wafers or substrates (not depicted), spaced apart in a generally parallel, axially aligned arrangement. A kinematic coupling 36 and a robotic handling flange 38 may be positioned on the exterior surface of bottom 18 and top 20 respectively to enable transfer and use of the container with automated handling equipment. Details of the construction and use of wafer containers and support means are disclosed in U.S. Pat. Nos. 5,788,082; 5,915,562; 6,010,008; 6,216,874; 6,267,245; 6,464,081; and 6,644,477, all owned by the owner of this invention, these patents all being fully incorporated herein by reference.

Figure 2:
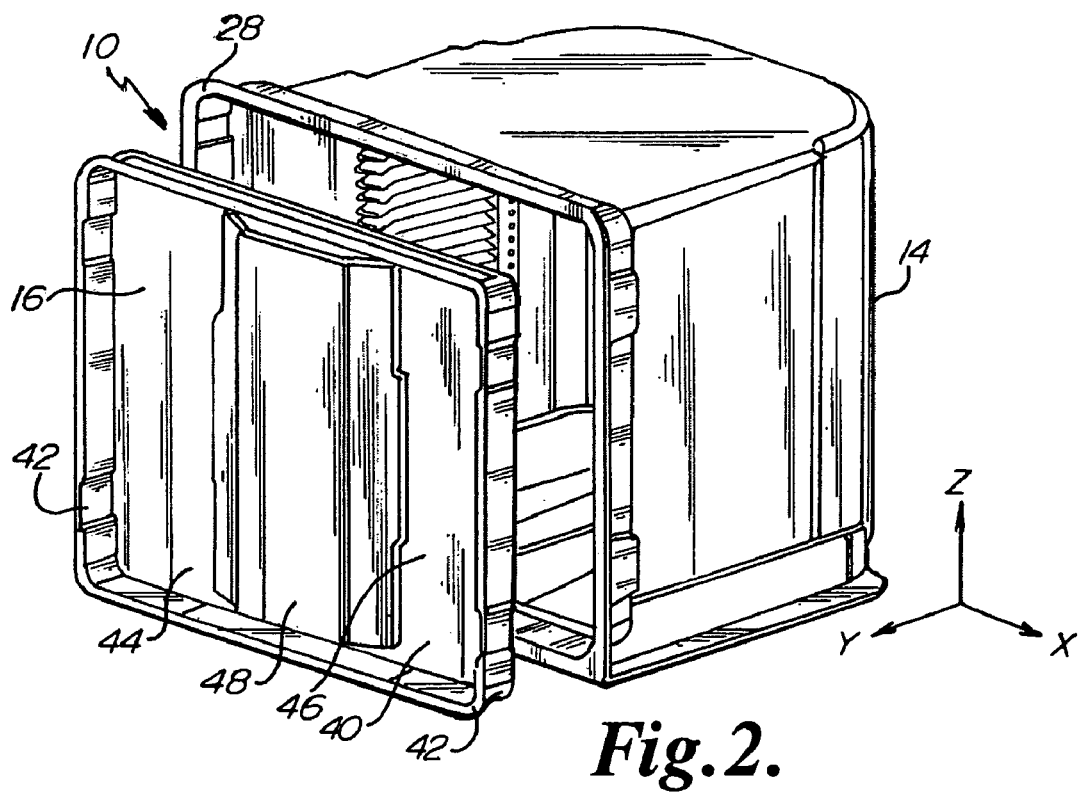
FIG. 2 is a perspective view of a wafer container according to an embodiment of the present invention with a partially assembled door.
Figure 3:
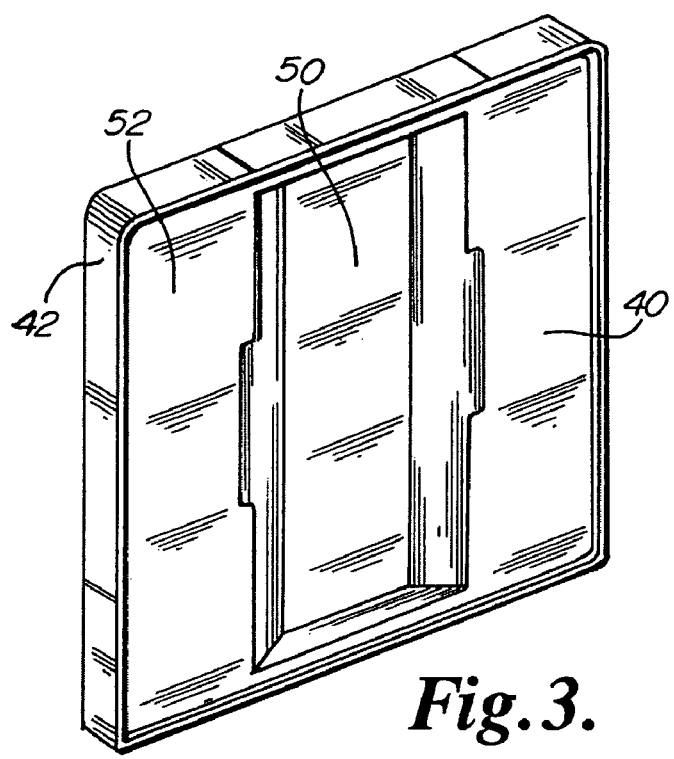
FIG. 3 is a perspective view of the interior side of a partially assembled door for a wafer container.
Figure 4:
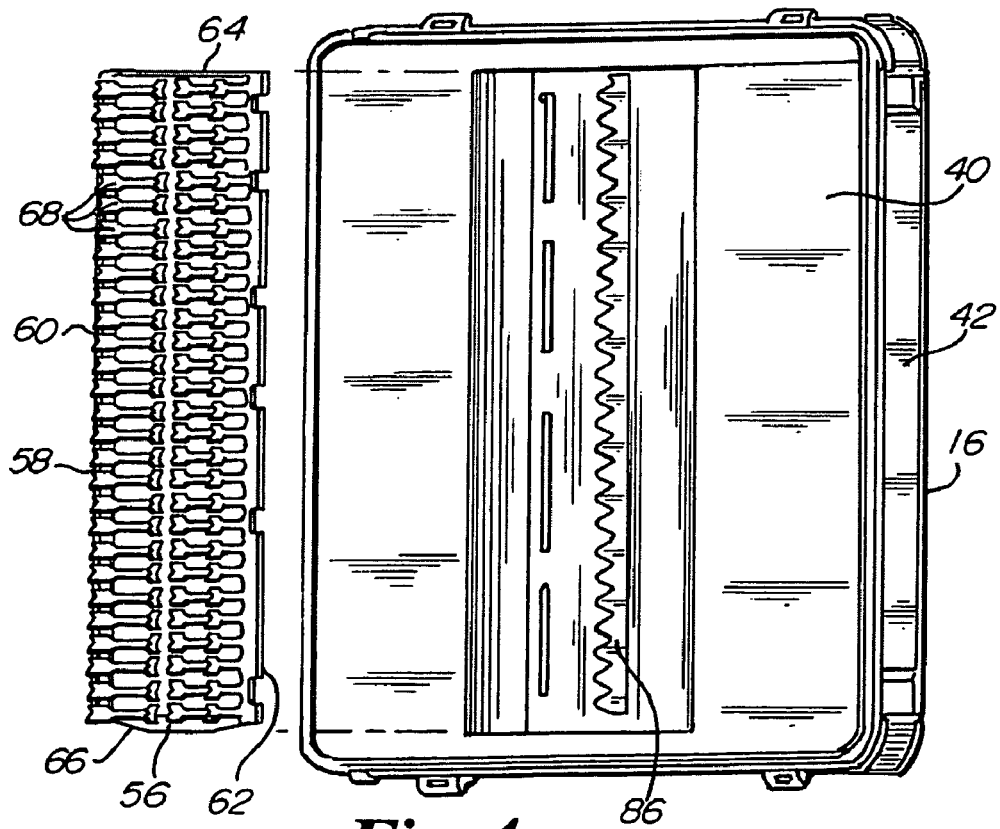
FIG. 4 is an interior side perspective exploded view of a wafer container door according to an embodiment of the invention.
Figure 5:
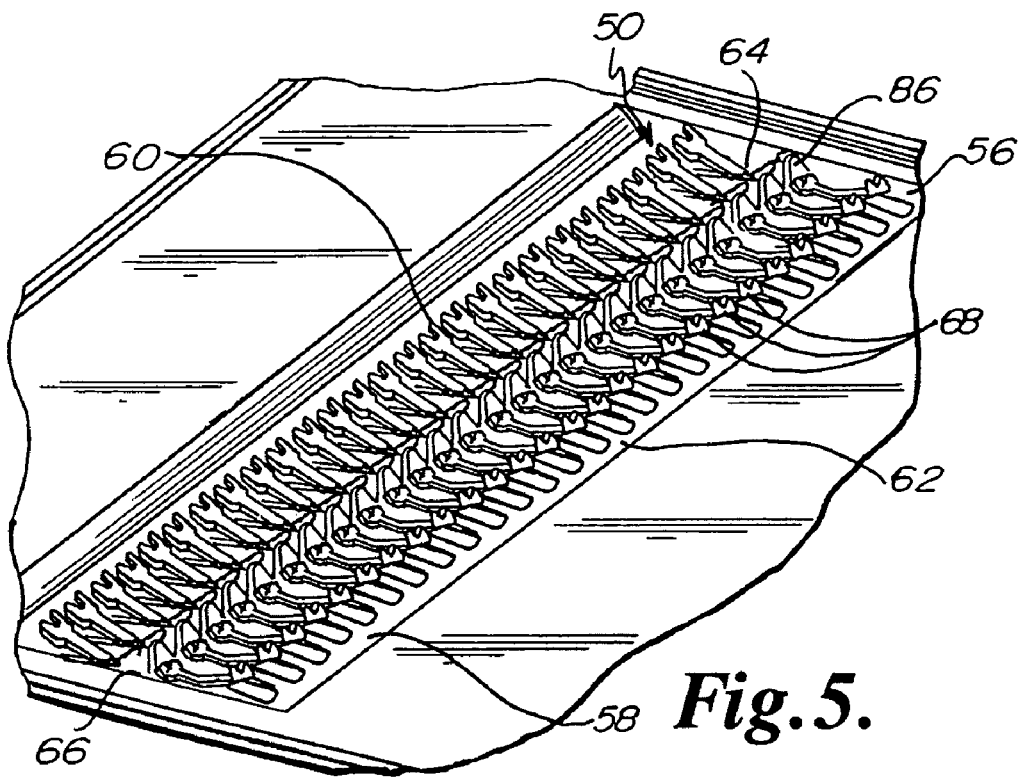
FIG. 5 is an interior side perspective view of the door of FIG. 4 in an assembled condition.
Figure 6:
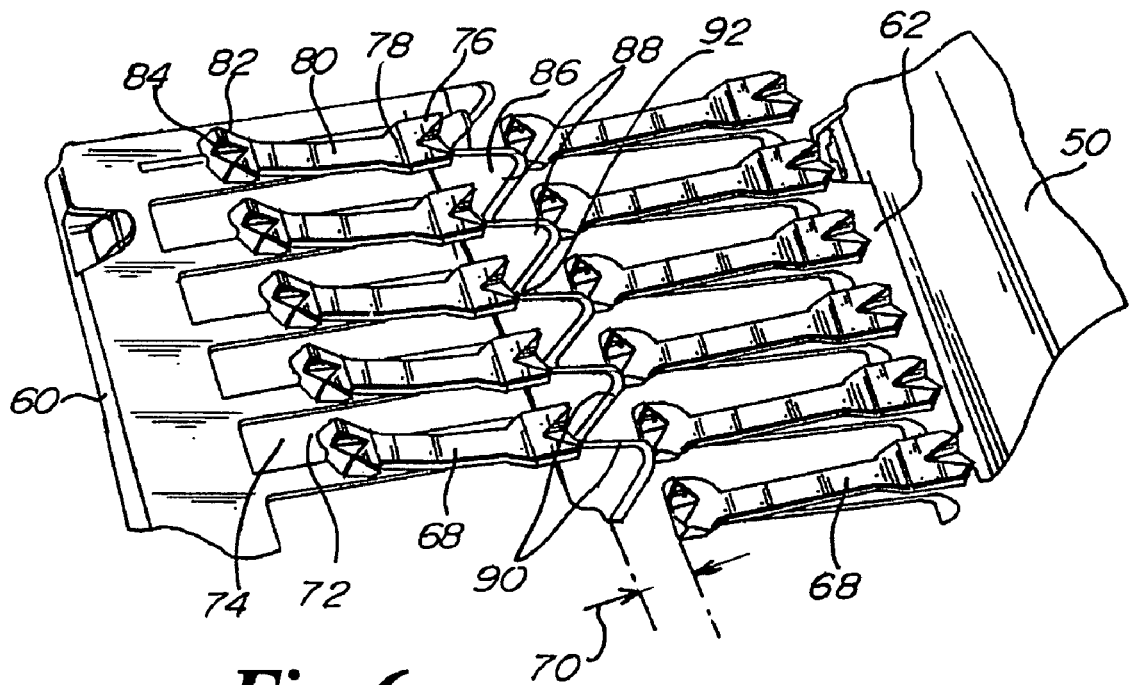
FIG. 6 is an enlarged perspective view of a portion of the primary and secondary wafer restraint portions of the door of FIG. 4.
Figure 7:
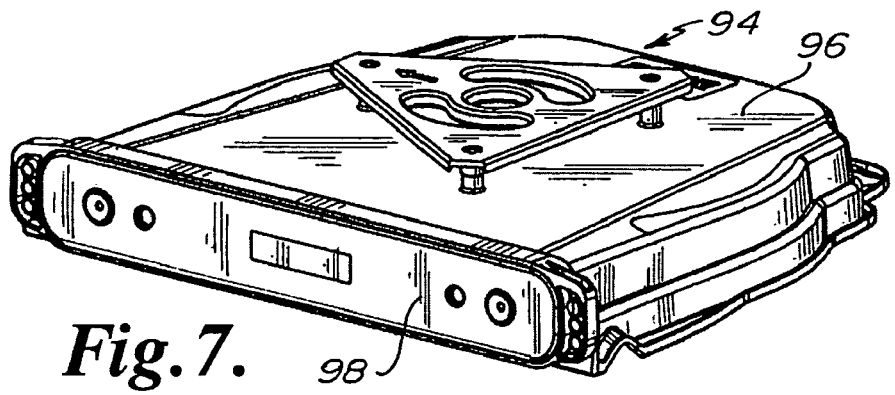
FIG. 7 is a perspective view of another embodiment of a wafer container according to the present invention.
Figure 8:
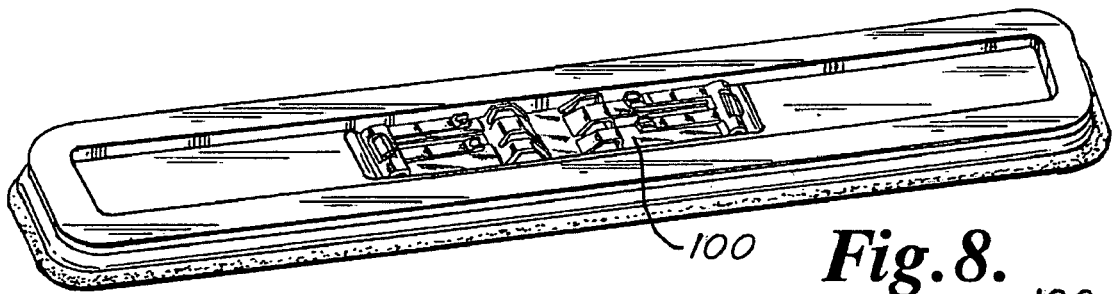
FIG. 8 is an interior perspective view of the door of the wafer container of FIG. 7.
Figure 10:
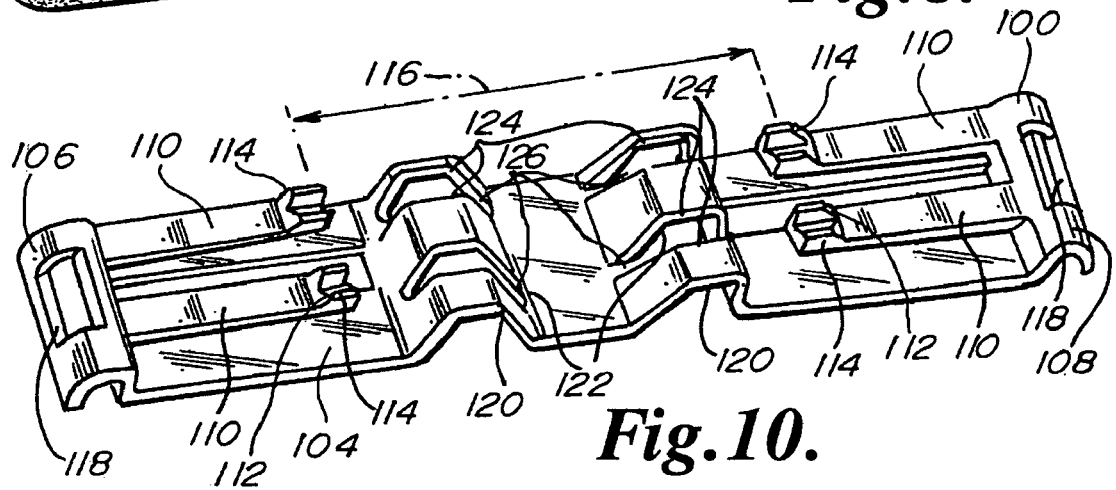
FIG. 10 is a perspective view of the wafer restraint of the door of FIG. 7.
Figure 9:
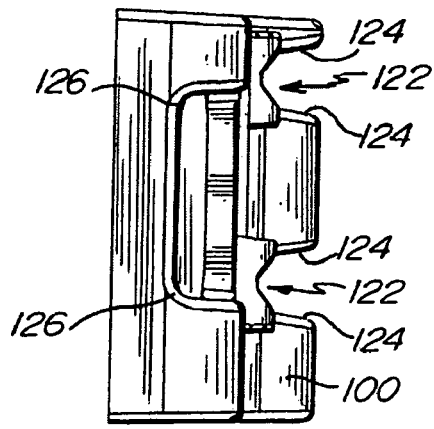
FIG. 9 is a side elevation view the wafer restraint portion of the door of FIG. 7.

Door 16 is selectively sealingly positionable in door frame 30 to sealingly close wafer container 10 to form a sealed microenvironment for wafers therein. In an embodiment depicted in FIGS. 2 and 3, door 16 generally includes a body portion 40 with a perimeter wall 42. A pair of latch recesses 44, 46, are defined on the exterior side 48 of body portion 40, while a wafer restraint recess 50 is defined on the interior side 52. Latching mechanisms, such as those disclosed in U.S. Pat. No. 5,915,562, previously incorporated herein by reference are disposed in each of latch recesses 44, 46, to secure door 16 in place in door frame 28. A cover 52 may be disposed over the latches, with keyhole slots 54 to enable actuation of the latch mechanisms from the exterior of the container 10.

Wafer restraint structure 56 is secured in wafer restraint recess 50. Wafer restraint structure 56 includes a perimeter frame 58 having a pair of side rails 60, 62, a top rail 64, and a bottom rail 66. Resilient wafer engaging members in the form of flexible fingers 68 project inwardly in perimeter frame 58 from side rails 60, 62, and are opposingly positioned across a gap 70. Each finger 68 has a first elongate portion 72 with proximal end 74 connected with side rail 60 or 62. An inner synclinally shaped wafer receiving portion 76 is positioned at distal end 78 of each first elongate portion 72. A second elongate portion 80 projects outwardly from inner wafer receiving portion 76 and has an outboard end 82 with an outer synclinally shaped wafer receiving portion 84. Flexible fingers 68 are opposingly paired across gap 70 so that the edge of a generally planar wafer is received in the inner 76 and outer 84 wafer receiving portions of each of the pair of fingers 68, thereby restraining and cushioning the wafer at four points of contact.

According to an embodiment of the invention, a secondary wafer restraining structure 86 is positioned in gap 70 to inhibit vertical movement of wafers during shock events and resultant dislodgement and cross-slotting of wafers. Secondary wafer restraining structure 86 generally includes a plurality of synclinally shaped wafer restraint portions 88, projecting outwardly from the interior side 52 of door 16. Each wafer restraint portion 88 includes a pair of opposingly slanted edges or surfaces 90, meeting at junction 92. Junction 92 of each wafer restraint portion 88 is positioned to align with inner 76 and outer 84 wafer receiving portions of each opposing pair of fingers 68, and so that when door 16 is fully sealingly engaged in door frame 30, the edge of the wafer is contacting junction 92. In this position, any vertical movement of the wafer due to shock imparted to container 10 causes the wafer to contact surfaces or edges 90, thereby limiting such movement. The positioning of wafer restraint portions 88 between and proximate opposing fingers 68 limits deflection of the wafer between support points and thereby further inhibits the wafer from "jumping" out of the supports and cross-slotting.

It will be appreciated that, although secondary wafer restraining structure 86 is depicted as a single saw tooth shaped structure, each wafer restraint portion 88 may also be a separate structure within the scope of the invention. Further, it will be appreciated that secondary wafer restraining structure 86 may be formed as an integral part of body portion 40 of door 16, or may be a separately attached structure, or may be a part of wafer restraint structure 56. Secondary wafer restraining structure 86 may be formed from any material suitable for use in wafer containers, such as polycarbonate, PEEK, PEI, or other thermoplastic material having desirable properties, and may include carbon or other fillers for providing static dissipation or electrical conductivity.

Another embodiment of a wafer container 94 according to the invention is depicted in FIGS. 7-10. Wafer container 94 generally includes an enclosure portion 96 and a door 98 for selectively sealingly enclosing the container 94. Further details of wafer container 94 are disclosed in U.S. Provisional Patent Application Ser. No. 60/592,156, commonly owned by the owners of the present invention and hereby fully incorporated herein by reference.

According to the invention, wafer restraint 100 is positioned on the inner surface 102 of door 98. Wafer restraint 100 generally includes a body portion 104 having a pair of opposing ends 106, 108. Pairs of flexible fingers 110 project inwardly from each end 106, 108 toward the center of body portion 104. At the inward end 112 of each finger 110 is a synclinally shaped wafer receiving portion 114. Flexible fingers 110 are opposingly paired across gap 116 so that the edge of a generally planar wafer is received in the wafer receiving portions 114 of each of the pair of fingers 110. At ends 106, 108, body portion 104 has apertures 118 for receiving a fastening structure (not depicted) on door 98 to secure wafer restraint 100 to the door.

Body portion 104 has a pair of raised portions 120 positioned in gap 116 between the opposing fingers 110. Each raised portion has synclinal notches 122 positioned so as to align with the wafer receiving portions 114 of opposing fingers 110. Each synclinal notch 122 is defined by a pair of converging edges or surfaces 124, which meet at a junction 126. Junction 126 is positioned so that when door 98 is fully sealingly engaged with enclosure portion 96, the edge of the wafer is contacting junction 126. In this position, any vertical movement of the wafer due to shock imparted to container 94 causes the wafer to contact surfaces or edges 124, thereby limiting such movement. The positioning of secondary wafer restraints in the form of synclinal notches 122 between and proximate opposing fingers 110 limits deflection of the wafer between support points and thereby further inhibits the wafer from "jumping" out of the supports and cross-slotting.

Again, other configurations of wafer restraint 100 are contemplated within the present invention, including configurations in which the secondary wafer restraints may be saw tooth shaped structures, and wherein the secondary wafer restraints may be either integral or separate from the flexible fingers. The secondary wafer restraint may be formed from any material suitable for use in wafer containers, such as polycarbonate, PEEK, PEI, or other thermoplastic material having desirable properties, and may include carbon or other fillers for providing static dissipation or electrical conductivity.

What is claimed is:

1. The combination of a plurality of wafers and a container for holding the wafers in an axially aligned, generally parallel spaced apart arrangement, the container comprising:
  an enclosure portion having a top, a bottom, a pair of opposing sides, a back and an opposing open front defined by a door frame;
  a door sealingly receivable in the door frame to close the open front; and
  a wafer restraint system comprising at least one wafer support structure in the enclosure portion and a wafer restraint structure on the door for engaging and restraining the wafers, the at least one wafer support structure including a plurality of wafer support shelves defining a plurality of slots, each slot adapted to receive a separate one of the plurality of wafers, the wafer restraint structure on the door comprising a primary restraint structure and a secondary restraint structure, the primary restraint structure comprising a plurality of resilient wafer engaging members arranged so that a first plurality of the wafer engaging members is spaced apart from and opposing a second plurality of the wafer engaging members, wherein each of the resilient wafer engaging members comprises a first elongate connecting portion and a first synclinally shaped wafer receiving portion, the first wafer receiving portion positioned proximate a first end of the first connecting portion, a second end of the first connecting portion being operably coupled with the door, the secondary restraint structure positioned intermediate the first and second pluralities of wafer engaging members and defining a plurality of notches, the notches arranged so that a separate one of the plurality of wafers is received in each notch when the door is engaged in the door frame.

2. The combination of claim 1, wherein the primary restraint structure includes a perimeter frame defining a central aperture and having a pair of side rails, the resilient wafer engaging members projecting into the central aperture from the side rails.

3. The combination of claim 1, wherein each resilient wafer engaging member further comprises a second elongate portion and a second synclinally shaped wafer receiving portion, a first end of the second elongate portion operably coupled with the first connecting portion proximate the first wafer receiving portion, the second wafer receiving portion positioned on the second connecting portion at a location spaced apart from the first wafer receiving portion.

4. The combination of claim 1, wherein the wafer restraint structure comprises a body portion having a pair of opposing sides and a center portion, the resilient wafer engaging members of the primary restraint structure projecting inwardly toward the center portion from each of the opposing sides.

5. The combination of claim 4, wherein the body portion of the wafer restraint structure has a raised portion proximate the center, wherein the raised portion defines the notches of the secondary restraint structure.

6. The combination of claim 1, wherein the notches are each defined by a pair of converging edges meeting at a junction, the junction positioned so that when the door is fully received in the door frame, each wafer contacts a separate one of the junctions.

7. The combination of claim 1, wherein the door has an interior side, and wherein the secondary restraint structure is integrally formed with and projects outwardly from the interior side of the door.

8. The combination of a plurality of wafers and a container for holding the wafers in an axially aligned, generally parallel spaced apart arrangement, the container comprising:
  an enclosure portion having a top, a bottom, a pair of opposing sides, a back and an opposing open front defined by a door frame;
  a door sealingly receivable in the door frame to close the open front; and
  a wafer restraint system comprising at least one wafer support structure in the enclosure portion and a wafer restraint structure on the door for engaging and restraining the wafers, the at least one wafer support structure including a plurality of wafer support shelves defining a plurality of slots, each slot adapted to receive a separate one of the plurality of wafers, the wafer restraint structure on the door comprising a primary restraint structure including a plurality of resilient wafer engaging members arranged so that a first plurality of the wafer engaging members is spaced apart from and opposing a second plurality of the wafer engaging members, wherein each of the resilient wafer engaging members comprises a first elongate connecting portion and a first synclinally shaped wafer receiving portion, the first wafer receiving portion positioned proximate a first end of the first connecting portion, a second end of the first connecting portion being operably coupled with the door, the wafer restraint structure further comprising a secondary restraint structure positioned intermediate the first and second pluralities of wafer engaging members.

9. The combination of claim 8, wherein the secondary restraint structure comprises a plurality of notches, each notch defined by a pair of converging surfaces meeting at a junction, the junction positioned so that when the door is fully received in the door frame, each wafer contacts a separate one of the junctions.

10. The combination of claim 8, wherein the primary restraint structure includes a perimeter frame defining a central aperture and having a pair of side rails, the resilient wafer engaging members projecting into the central aperture from the side rails.

11. The combination of claim 8, wherein each resilient wafer engaging member further comprises a second elongate portion and a second synclinally shaped wafer receiving portion, a first end of the second elongate portion operably coupled with the first connecting portion proximate the first wafer receiving portion, the second wafer receiving portion positioned on the second connecting portion at a location spaced apart from the first wafer receiving portion.

12. The combination of claim 8, wherein the wafer restraint structure comprises a body portion having a pair of opposing sides and a center portion, the resilient wafer engaging members of the primary restraint structure projecting inwardly toward the center portion from each of the opposing sides.

13. The combination of claim 12, wherein the body portion of the wafer restraint structure has a raised portion proximate the center, and wherein the means for inhibiting the wafers from being dislodged comprises a plurality of notches defined in the raised portion.

14. A container for holding a plurality of wafers in an axially aligned, generally parallel spaced apart arrangement, the container comprising:
- an enclosure portion having a top, a bottom, a pair of opposing sides, a back and an opposing open front;
- a door for sealingly closing the open front; and
- a wafer restraint system comprising at least one wafer support structure in the enclosure portion and a wafer restraint structure on the door for engaging and restraining the wafers, the at least one wafer support structure including a plurality of wafer support shelves defining a plurality of slots, each slot adapted to receive a separate one of the plurality of wafers, the wafer restraint structure on the door comprising a primary restraint structure and a secondary restraint structure, the primary restraint structure comprising a plurality of resilient wafer engaging members arranged so that a first plurality of the wafer engaging members is spaced apart from and opposing a second plurality of the wafer engaging members, each wafer engaging member having a wafer contact portion spaced apart a first distance from the door, the secondary restraint structure positioned intermediate the first and second pluralities of wafer engaging members, the secondary restraint structure defining a plurality of generally v-shaped grooves, each groove registered with a separate one of the wafer engaging members of the first plurality and a separate one of the wafer engaging members of the second plurality, wherein portions of the secondary restraint structure on either side of each groove project from the door a second distance greater than the first distance by which each wafer contact portion is spaced apart from the door.

15. The combination of claim 14, wherein the primary restraint structure includes a perimeter frame defining a central aperture and having a pair of side rails, the resilient wafer engaging members projecting into the central aperture from the side rails.

16. The combination of claim 14, wherein each of the resilient wafer engaging members comprises a first elongate connecting portion and a first synclinally shaped wafer receiving portion, the first wafer receiving portion positioned proximate a first end of the first connecting portion, a second end of the first connecting portion being operably coupled with the door.

17. The combination of claim 16, wherein each resilient wafer engaging member further comprises a second elongate portion and a second synclinally shaped wafer receiving portion, a first end of the second elongate portion operably coupled with the first connecting portion proximate the first wafer receiving portion, the second wafer receiving portion positioned on the second connecting portion at a location spaced apart from the first wafer receiving portion.

18. The combination of claim 14, wherein the wafer restraint structure comprises a body portion having a pair of opposing sides and a center portion, the resilient wafer engaging members of the primary restraint structure projecting inwardly toward the center portion from each of the opposing sides.

19. The combination of claim 18, wherein the body portion of the wafer restraint structure has a raised portion proximate the center, wherein the raised portion defines the grooves of the secondary restraint structure.

20. The combination of claim 14, wherein the door has an interior side, and wherein the secondary restraint structure is integrally formed with the door.

\* \* \* \* \*